United States Patent
Xie et al.

(10) Patent No.: US 9,326,403 B2
(45) Date of Patent: Apr. 26, 2016

(54) WATERPROOF CAP FOR PORTS IN ELECTRONIC DEVICES

(71) Applicants: AMBIT MICROSYSTEMS (SHANGHAI) LTD., Shanghai (CN); HON HAI PRECISION INDUSTRY CO., LTD., New Taipei (TW)

(72) Inventors: Xiang-Hong Xie, Shanghai (CN); Lin-Zhi Duan, Shanghai (CN); Deng-Lai Ke, Shanghai (CN)

(73) Assignees: AMBIT MICROSYSTEMS (SHANGHAI) LTD., Shanghai (CN); HON HAI PRECISION INDUSTRY CO., LTD., New Taipei (TW)

( * ) Notice: Subject to any disclaimer, the term of this patent is extended or adjusted under 35 U.S.C. 154(b) by 2 days.

(21) Appl. No.: 14/509,916

(22) Filed: Oct. 8, 2014

(65) Prior Publication Data
US 2015/0245512 A1    Aug. 27, 2015

(30) Foreign Application Priority Data
Feb. 26, 2014    (CN) .......................... 2014 1 0064040

(51) Int. Cl.
*H05K 5/02*    (2006.01)
*G06F 1/16*    (2006.01)
*H04M 1/02*    (2006.01)

(52) U.S. Cl.
CPC .............. *H05K 5/0239* (2013.01); *G06F 1/16* (2013.01); *H04M 1/02* (2013.01)

(58) Field of Classification Search
USPC .......................................................... 174/66
See application file for complete search history.

(56) References Cited

U.S. PATENT DOCUMENTS

| 8,644,011 B2 | 2/2014 | Parkinson |
| 8,644,032 B2 * | 2/2014 | Liang .................. H05K 5/0247 361/679.3 |

FOREIGN PATENT DOCUMENTS

| CN | 200510085171 | 1/2007 |
| TW | M439325 U1 | 10/2012 |
| TW | M444538 U1 | 1/2013 |
| TW | M454702 U1 | 6/2013 |
| TW | M460498 U1 | 8/2013 |

* cited by examiner

*Primary Examiner* — Dhirubhai R Patel
(74) *Attorney, Agent, or Firm* — Novak Druce Connolly Bove + Quigg LLP (57) ABSTRACT

A waterproof cap for electronic devices includes a cover plate and sealing base located on a surface of the cover plate for sealing a port of a housing of the electronic devices. A first lip and a second lip are located on an outer periphery of the sealing base and are spaced apart from each other. The first lip is located between the cover plate and the second lip. When the sealing base is inserted into the port of the housing of the electronic devices, the first lip is configured to tilt toward the cover plate, and the second lip is configured to tilt away from the cover plate.

13 Claims, 8 Drawing Sheets

WATERPROOF CAP FOR PORTS IN ELECTRONIC DEVICES

FIELD

The present disclosure relates to waterproof caps, and more particularly to a waterproof cap for sealing ports of electronic devices.

BACKGROUND

An electronic device is provided with various ports providing access for transmitting data or functions. Contaminants often get into the electronic device through the ports, which can result in damage to electronic components of the electronic devices. Traditionally, a waterproof structure is utilized to seal the ports of the electronic devices, but the traditional waterproof structures can come loose and slide out of the port.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like reference numerals indicate the same or similar elements. It should be noted that references to "an" or "one" embodiment in this disclosure are not necessarily to the same embodiment, and such references can mean "at least one."

Figure 1:
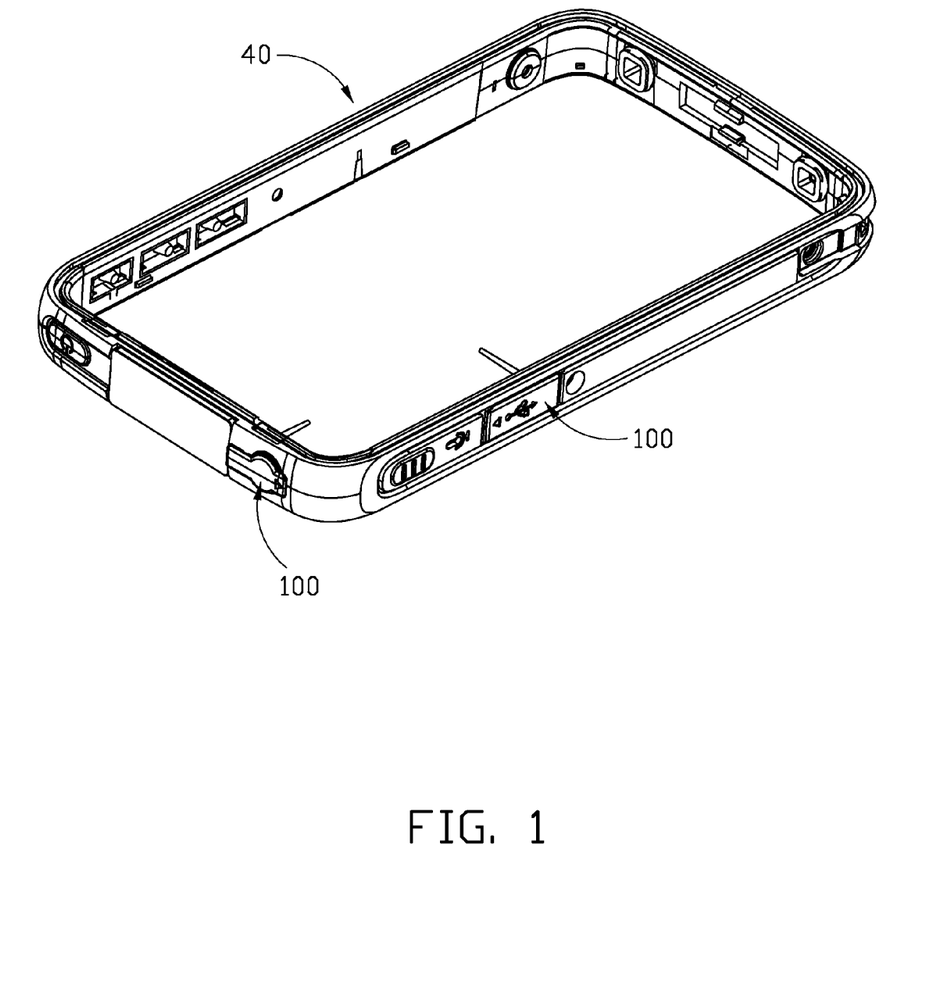
FIG. 1 is a perspective view of a housing for an electronic device with waterproof caps in place in in accordance with an embodiment.
Figure 2:
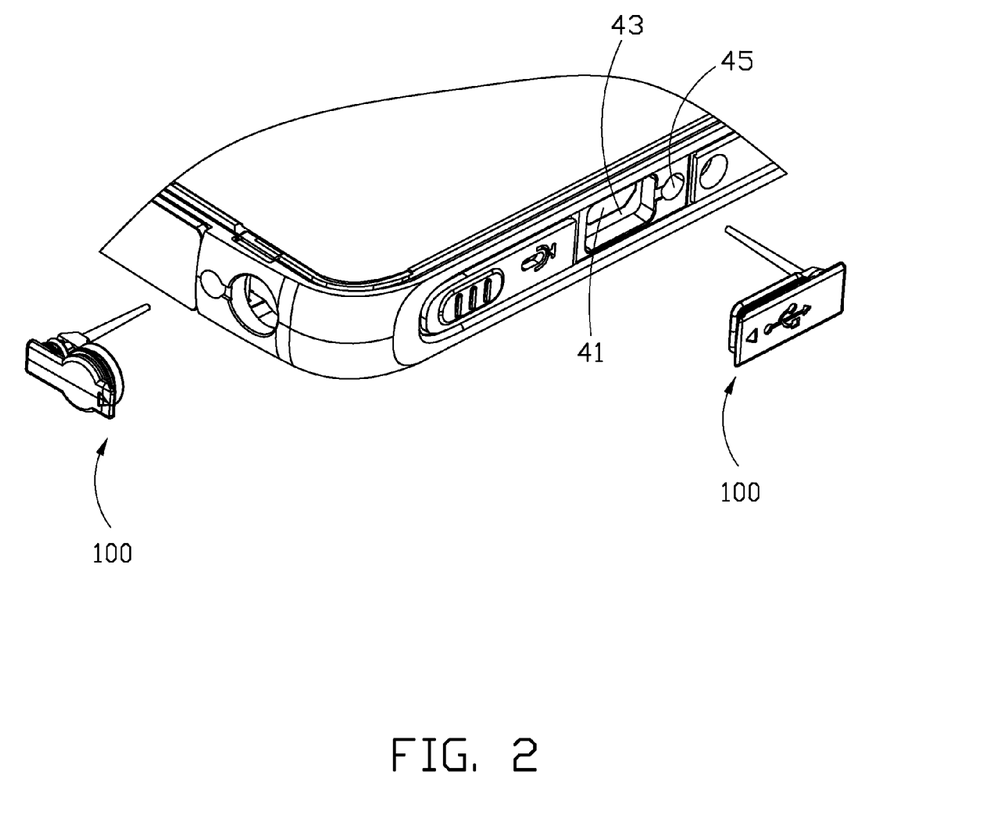
FIG. 2 is a partial exploded view of the electronic device housing illustrated in FIG. 1.

FIGS. 1 and 2 illustrate two waterproof structures in the form of caps 100 used for preventing contaminants from entering the electronic device. The electronic device includes a housing 40 and two connectors received in the housing (not shown). The housing 40 defines two ports 41 and two coupling holes 45. The ports 41 allow the connectors access to the housing 40. The housing 40 further includes a step surface surrounding the port 41. The waterproof structures 100 are inserted into the housing 40 for sealing the ports 41.

Figure 3:
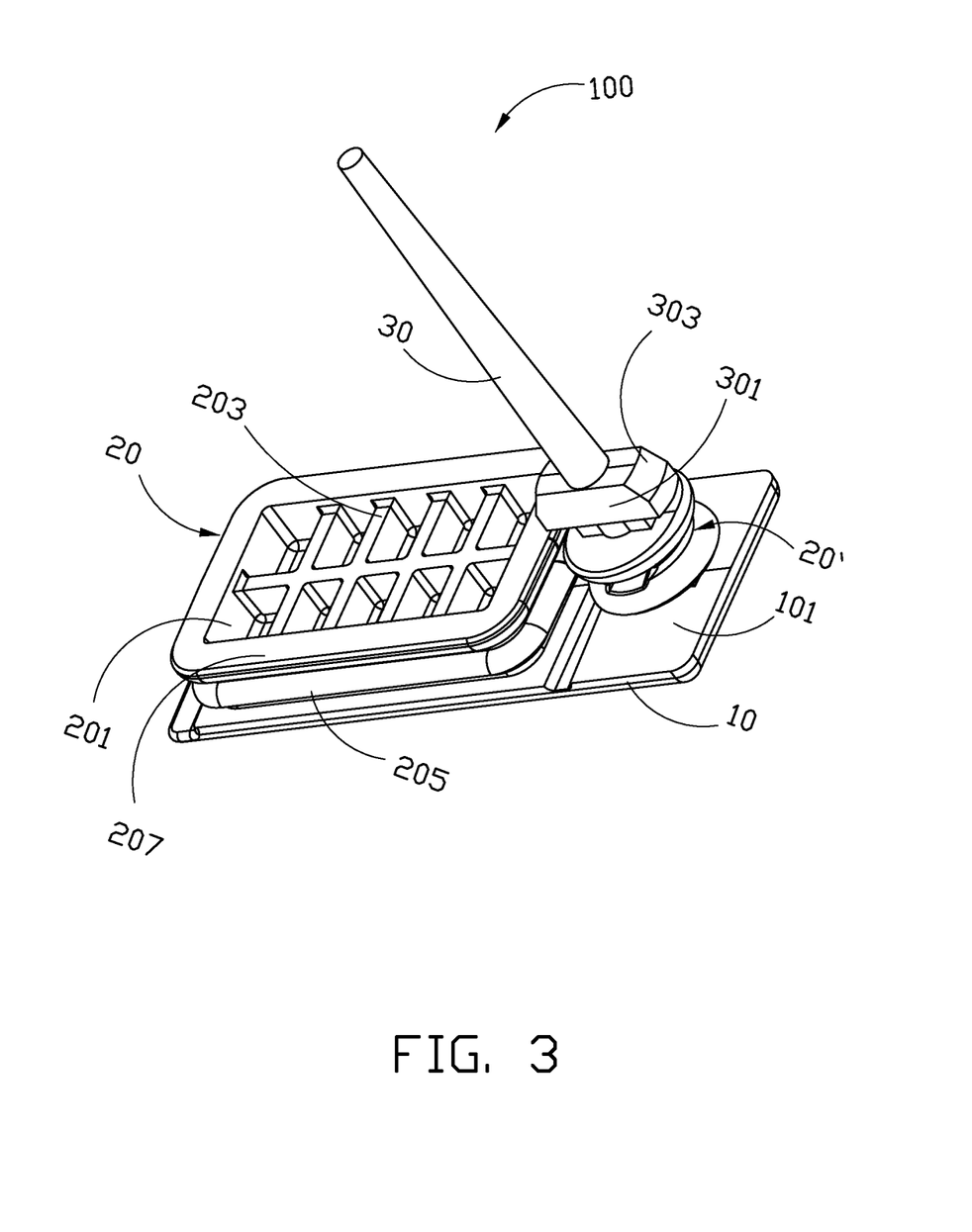
FIG. 3 is a perspective view of a waterproof cap illustrated in FIG. 1 in according to a first embodiment.
Figure 4:
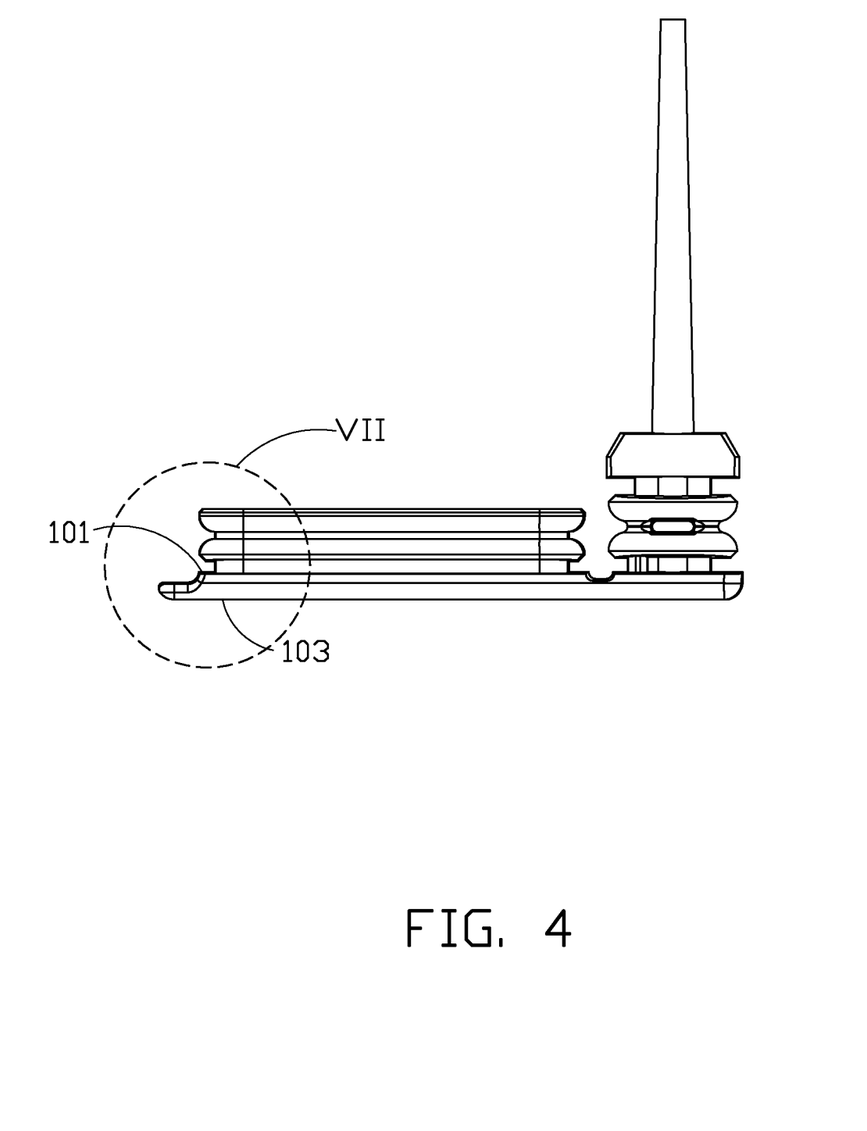
FIG. 4 is a side view of the waterproof cap illustrated in FIG. 3.
Figure 5:
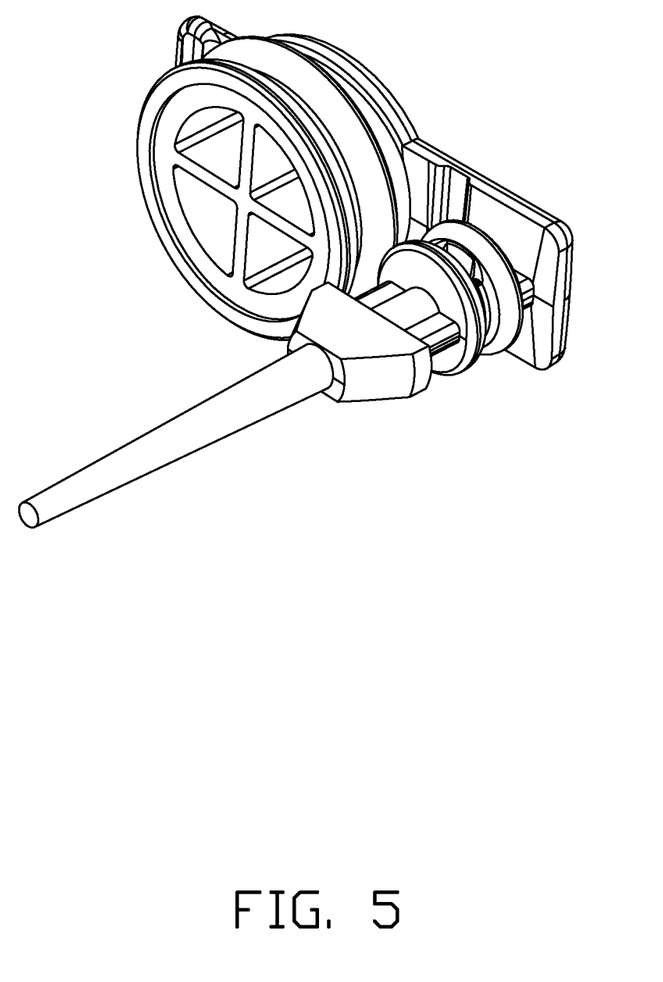
FIG. 5 is an isometric view of a waterproof cap illustrated in FIG. 1 in accordance with a second embodiment.

FIG. 3 illustrates a perspective view of one of the two waterproof caps 100. The waterproof structure 100 includes a cover plate 10, a coupling pin 30, and a sealing base 20. The sealing base 20 and the coupling pin 30 extend outward from a surface of the cover plate 10. The sealing base 20 is inserted into the port 41 to seal the port 41, and the coupling pin 30 is inserted into the coupling hole 45 to connect the waterproof structure 100 and the housing 40. In other embodiments, the coupling pin 30 can be omitted.

The cover plate 10 includes a first surface 101 and a second surface 103 opposite to the first surface 101. The first surface 101 faces the housing 40 when the waterproof structure 100 is assembled to the housing 40. The sealing base 20 and the coupling pin 30 are both located on the first surface 101.

A coupling block 301 is located on the coupling pin 30, and the coupling block 301 and the sealing base 20 utilized to seal the coupling hole 45 are spaced from each other, which allows the waterproof structure 100 to stretch or shrink within the coupling hole 45. The coupling block 301 has a first end and a second end with the first end positioned toward the cover plate 10. The coupling block 103 tapers inward toward the second end to form an incline surface 303, which allows the coupling block 301 to be easily inserted in the coupling hole 45. In the embodiment, there are two sealing bases 20, 20', the sealing base 20 is utilized to seal the port 41, and the sealing base 20' is utilized to seal the coupling hole 45. In other embodiments, the sealing base 20' can be omitted.

The sealing base 20 is perpendicularly extending from the first surface 101 of the cover plate 10. The shape of the sealing base 20 matches the shape of the port 41. The sealing base 20 includes a plurality of ribs 203, a first lip 205 and a second lip 207.

The plurality of ribs 203 are located in an inner space of the sealing base 20 and connected to a sidewall 201 of the sealing base 20. The ribs 203 are utilized to decrease deformation quantity when the sealing base 20 is inserted into the port 41, therefore, the sidewall 201 of the sealing base 20 can tightly contact the inner sidewall of the port 41.

The first lip 205 and the second lip 207 are located on the outer periphery of the sidewall of the sealing base 20. The first lip 205 is spaced apart from the second lip 207. The first lip 205 is located between the cover plate 10 and the second lip 207. That is, a groove 206 is defined between the first lip 205 and the second lip 207. In the embodiment, the groove 206 is a V-shaped groove. When the sealing base 20 is inserted into the port 41, the first lip 205 and the second lip 207 tightly contact the inner sidewall of the port 41 to form a double waterproof layer.

Figure 6:
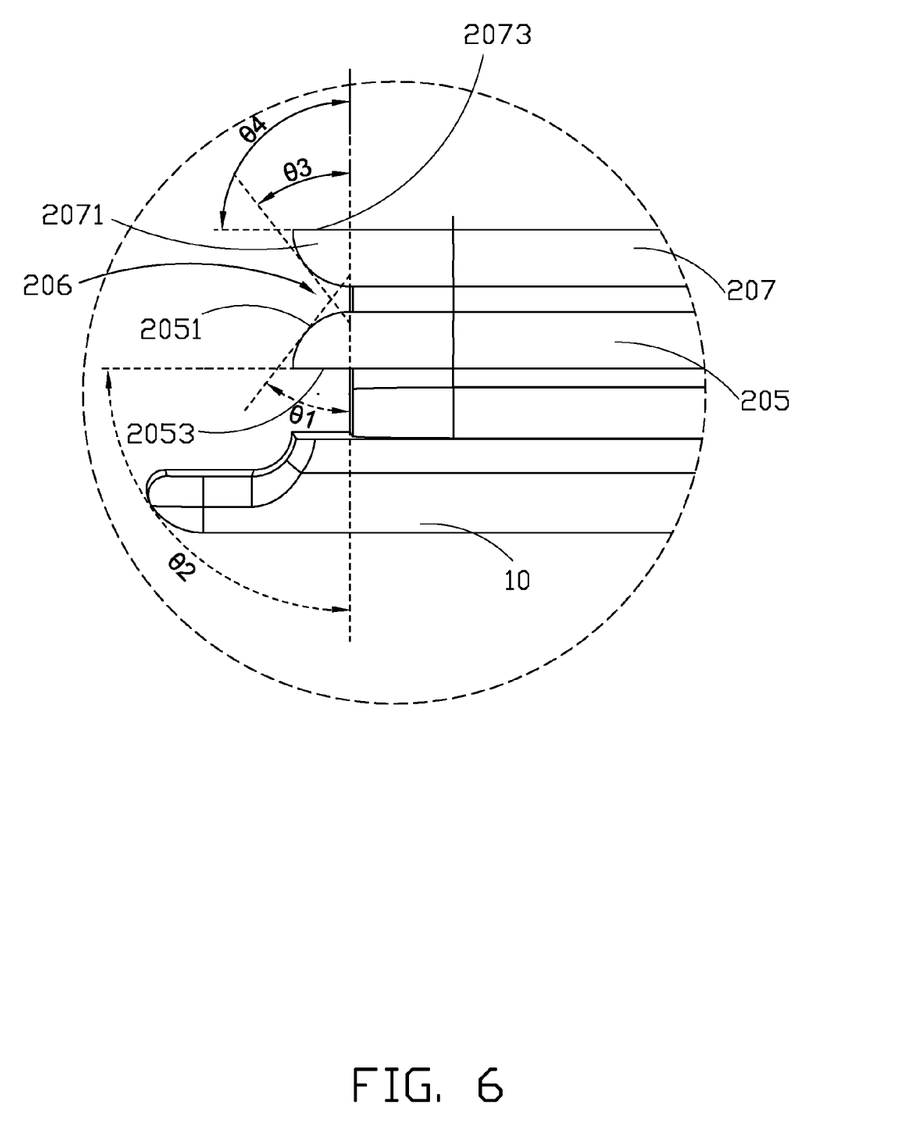
FIG. 6 is a cross-sectional view of an initial uninserted state of the waterproof cap illustrated in FIG. 1.

FIG. 6 illustrates an enlarged view of a portion of the first lip 205 and the second lip 207. The first lip 205 includes a first sidewall 2051 and a second sidewall 2053. A joint of the first sidewall 2051 and the second sidewall 2053 is rounded off. The first sidewall 2051 is configured to tilt toward the cover plate 10 and to form a first angle θ1 with respect to the outer surface of the sealing base 20. The second sidewall 2053 is configured to tilt toward the cover plate 10 and to form a second angle θ2 with respect the outer surface of the sealing base 20. The first angle θ1 formed by the first sidewall 2051 is less than 90 degrees. The second angle θ2 formed by the second sidewall 2053 is equal to or less than 90 degrees, and the second angle θ2 formed by the second sidewall 2053 is larger than the first angle θ1 formed by the first sidewall 2051. That is, the first lip 205 is in a state of inclining toward the cover plate 10, which allows the first lip 205 to be easily tilted when the inner sidewall of the port 41 is pressed against a top portion of the first sidewall 2051. In the embodiment, the second angle θ2 is equal 90 degrees. In other embodiments, the second angle θ2 can be less than 90 degrees, as long as the second angle θ2 is larger than the first angle θ1.

The second lip 207 includes a third sidewall 2071 and a fourth sidewall 2073. A joint of the third sidewall 2071 and the fourth sidewall 2073 is rounded off. The third sidewall 2071 is configured to tilt toward the inverse direction relative to the first sidewall and form a third angle θ3 with respect the outer surface of the sealing base 20. The fourth sidewall 2073 is configured to tilt toward the inverse direction relative to the first sidewall and to form a fourth angle θ4 with respect to the outer surface of the sealing base 20. The third angle θ3 formed by the third sidewall 2071 is less than 90 degrees, the fourth angle θ4 formed by the fourth sidewall 2073 is equal or less than 90 degrees, and the fourth angle θ4 formed by the fourth sidewall 2073 is larger than the third angle θ3 formed by the third sidewall 2071. That is, the second lip 207 is in a state of inclining away from the cover plate 10, which allows the second lip 207 to be easily tilted when the inner sidewall of the port 41 is pressed against a top portion of the third sidewall 2071. In the embodiment, the fourth angle θ4 is equal 90 degrees. In other embodiments, the fourth angle θ4 can be less than 90 degrees, as long as the fourth angle θ4 is larger than the third angle θ3.

In the embodiment, the first sidewall 2051 is an arc-shaped sidewall protruding away from the cover the cover plate 10, and the third sidewall 2071 is an arc-shaped sidewall protruding toward the cover plate 10.

Figure 7:
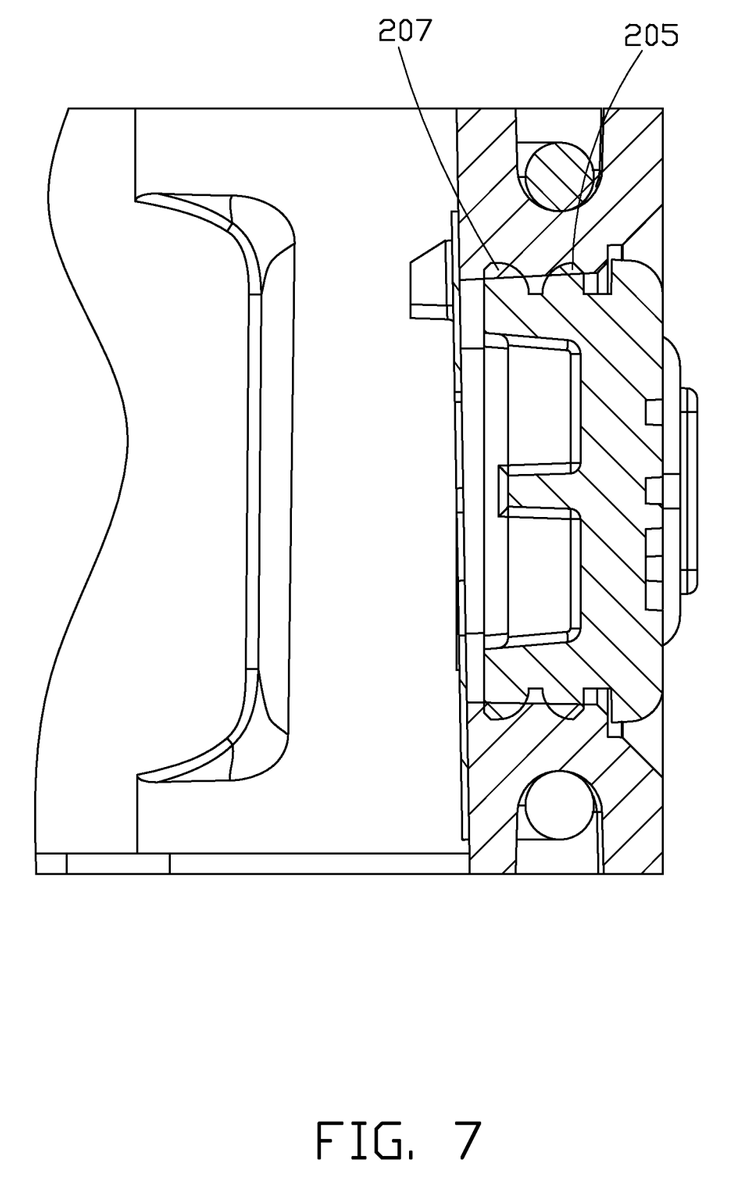
FIG. 7 is a cross-sectional view of a final inserted state of the waterproof cap illustrated in FIG. 1.
Figure 8:
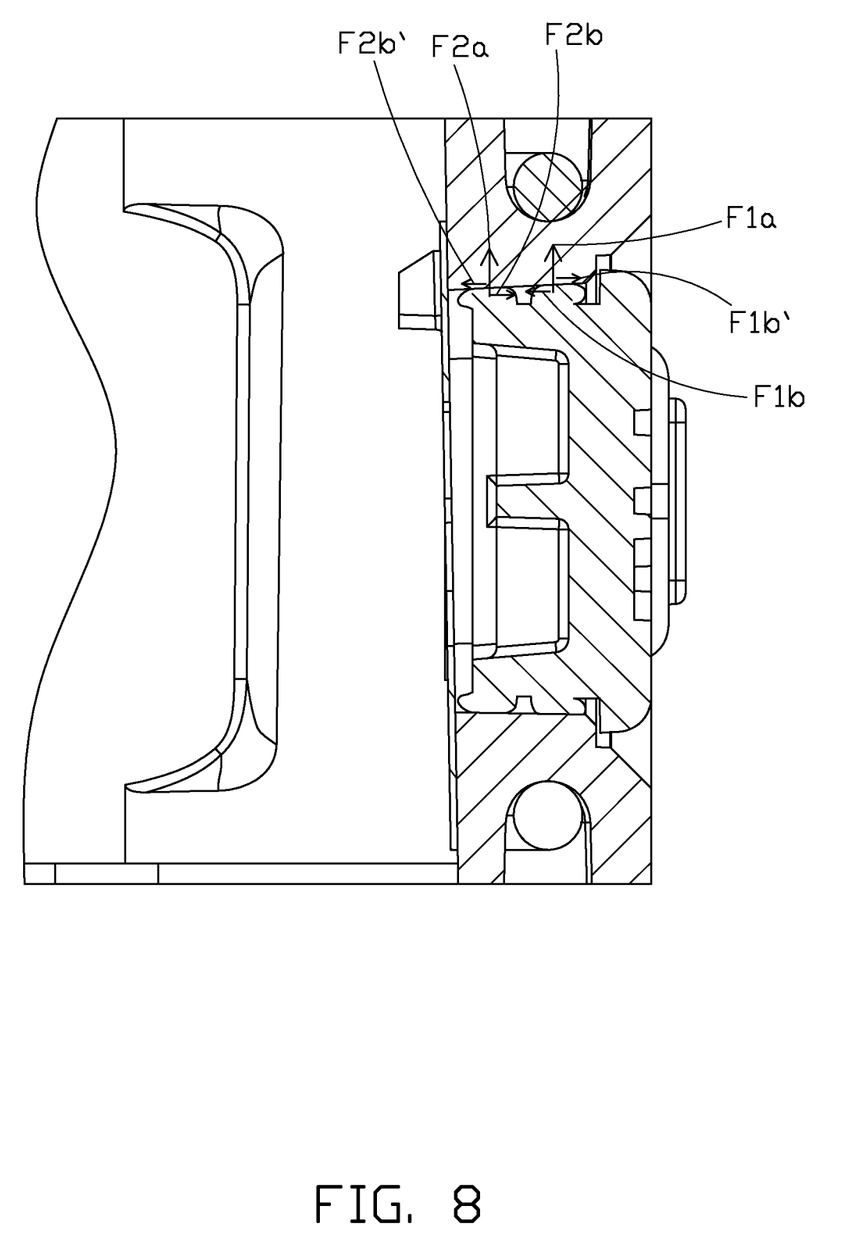
FIG. 8 is an enlarge view of circled portion VII of FIG. 4.

FIG. 7 illustrates an initial state of the first lip 205 and the second lip 207 before the sealing base 20 is inserted into the port 41. FIG. 8 shows a final state of the first lip 205 and the second lip 207 when the sealing base 20 is inserted into the port 41.

In assembly, the coupling pin 30 is inserted in the coupling hole 45 with the coupling block 301 passing through the coupling hole 45 and stopping in the coupling hole 45, which allows the waterproof structure 100 to freely move relative to the housing 40. The sealing base 20 is inserted into the port 41 and tightly contacts the inner sidewall of the port 41.

When the inner sidewall of the port 41 contacts the first lip 205, the first lip 205 is forced to tilt toward the cover plate 10, so a first resilience of the first lip 205 allows the first lip 205 to tightly contact the inner sidewall of the port 41. The first resilience of the first lip 205 can be divided into two parts: a force F1a and a force F1b. The force F1a is perpendicularly exerted onto the inner sidewall of the port 41, and the force F1b is exerted onto the inner sidewall of the port 41 in a direction away from the cover plate 10. Thus, the inner sidewall of the port 41 applies a reactive force F1b' onto the first lip 205 in a direction close to the cover plate 10. When the inner sidewall of the port 41 contacts the second lip 207, the second lip 207 is forced to tilt away from the cover plate 10, so a second resilience of the second lip 207 allows the second lip 207 to tightly contact the inner sidewall of the port 41. The second resilience of the second lip 207 can be divided into two parts: a force F2a and a force F2b. The force F2a is perpendicularly exerted onto the inner sidewall of the port 41, and the force F2b is exerted onto the inner sidewall of the port 41 in a direction close to the cover plate 10. Thus, the inner sidewall of the port 41 applies a reactive force F2b' onto the second lip 207 in a direction away from the cover plate 10.

Because the reactive force F1b' and the reactive force F2b' are in opposite directions, the reactive force F1b' offsets the reactive force F2b. The rib structure 203 described resists the waterproof structure 100 sliding out the port 41. The water flowing into the housing flows via the port 41, the water will flow into a space between the cover plate 10 and the first lip 205 first, so the first lip 205 is exerted with a pressure generated by water, which allows the first lip 205 tight contact on the inner sidewall of the port 41 improving waterproof performance.

Although various features and elements are described as embodiments in particular combinations, each feature or element can be used alone or in other various combinations within the principles of the present disclosure to the full extent indicated by the broad general meaning of the terms in which the appended claims are expressed.

What is claimed is:

1. A waterproof cap for a port in a housing of an electronic device comprising:
   a cover plate; and
   a sealing base mounted on the cover plate, and engagable with the housing for sealing the port and comprising a first lip and a second lip extending from the sealing base and spaced apart from each other;
   wherein the first lip is located between the cover plate and the second lip; when the sealing base is inserted into the port, the first lip tilts toward the cover plate, and the second lip tilts away from the cover plate,
   wherein the first lip comprises a first sidewall and a second sidewall, the first sidewall is configured to tilt toward the cover plate and to form a first angle with respect to an outer surface of the sealing base, the second sidewall is configured to tilt toward the cover plate and to form a second angle with respect to the outer surface of the sealing base, the second lip comprises a third sidewall and a fourth sidewall, the third sidewall is configured to tilt toward the inverse direction relative to the first sidewall and to form a third angle with respect to the outer surface of the sealing base, and the third sidewall is configured to tilt toward the inverse direction relative to the first sidewall and to form a fourth angle with respect to the outer surface of the sealing base.

2. The waterproof cap of claim 1 further comprising a coupling pin, wherein the coupling pin is located on the cover plate, and the coupling pin is inserted into a coupling hole defined in the housing to couple the waterproof cap to the housing.

3. The waterproof cap of claim 2, wherein the coupling pin comprises a coupling block having a first end and a second end with the first end positioned toward the cover plate, and the coupling block tapers inward toward the second end.

4. The waterproof cap of claim 1, wherein the first lip is configured to tilt toward the cover plate and have an angle less than 90 degrees with respect to an outer surface of the sealing base, and the second lip is configured to tilt toward an inverse direction relative to the first rib and have an angle less than 90 degrees with respect to the outer surface of the sealing base.

5. The waterproof cap of claim 1, wherein the first angle is less than 90 degrees, the second angle is approximately equal to 90 degrees, the third angle is less than 90 degrees, and the fourth angle is approximately equal to 90 degrees.

6. The waterproof cap of claim 1, wherein the first angle is less than the second angle, the first angle and the second angle are both less than 90 degrees, the third angle is less than the fourth angle, and the third angle and the fourth angle are both less than 90 degrees.

7. The waterproof cap of claim 1, wherein the first sidewall is an arc-shaped sidewall protruding away from the cover plate, and the third sidewall is an arc-shaped sidewall protruding toward the cover plate.

8. The waterproof cap of claim 1, wherein a plurality of ribs is located in the sealing base.

9. A waterproof cap for a port in a housing of an electronic device comprising:
   a cover plate;
   a sealing base located at the cover plate; and a first lip and a second lip located on an outer periphery of a sidewall of the sealing base;

wherein a groove is located on a top surface of the protrusion to divide the the first lip and the second lip, wherein the first lip adjacent to the cover plate tilts toward the cover plate, the second lip opposite to the first lip tilts away from the cover plate when the sealing base is inserted into the port.

10. The waterproof structure for electronic devices of claim 9, wherein the groove is a V-shaped groove, the groove has a set of opposite arc-shaped sidewalls protruding toward each other.

11. The waterproof structure for electronic devices of claim 9, wherein a first surface of the first lip adjacent to the cover plate is perpendicular to the sealing base, a second surface of the second lip opposite to the first surface is perpendicular to the sealing base.

12. The waterproof structure for electronic devices of claim 9 further comprising a coupling pin, wherein the coupling pin is located at the cover plate, and the coupling pin is inserted into a coupling hole defined in the housing to assemble the waterproof structure to housing.

13. The waterproof structure for electronic devices of claim 12, wherein the coupling pin comprises a coupling block, the coupling block and the sealing base are spaced with each other, and an end of the coupling block away from the cover plate is provided with an incline surface.

* * * * *